United States Patent
Wu et al.

(10) Patent No.: US 8,723,048 B2
(45) Date of Patent: May 13, 2014

(54) THREE-DIMENSIONAL COILING VIA STRUCTURE FOR IMPEDANCE TUNING OF IMPEDANCE DISCONTINUITY

(75) Inventors: Zhonghua (Ken) Wu, Fremont, CA (US); Reza Sharifi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 276 days.

(21) Appl. No.: 13/100,687

(22) Filed: May 4, 2011

(65) Prior Publication Data

US 2012/0112868 A1 May 10, 2012

Related U.S. Application Data

(60) Provisional application No. 61/411,669, filed on Nov. 9, 2010.

(51) Int. Cl.
*H05K 1/11* (2006.01)
(52) U.S. Cl.
USPC .......................................... 174/262; 174/255
(58) Field of Classification Search
CPC ..................................................... H01F 5/003
USPC .............................. 174/255, 260, 262; 29/846
See application file for complete search history.

(56) References Cited

U.S. PATENT DOCUMENTS

| | | | | |
|---|---|---|---|---|
| 7,897,880 B1 * | 3/2011 | Goergen et al. | | 174/262 |
| 8,119,921 B1 * | 2/2012 | Goergen et al. | | 174/255 |
| 8,158,890 B1 * | 4/2012 | Chang | | 174/262 |
| 8,203,082 B2 * | 6/2012 | Pai et al. | | 174/266 |
| 8,350,161 B2 * | 1/2013 | Yamanaka et al. | | 174/261 |
| 2003/0209813 A1 * | 11/2003 | Azuma | | 257/797 |
| 2008/0272875 A1 * | 11/2008 | Huang et al. | | 336/182 |
| 2013/0069750 A1 * | 3/2013 | Singh et al. | | 336/115 |

OTHER PUBLICATIONS

"MicroXCT—3D X-Ray Computed Tomography System," Xradia Inc., copyright 2010, 2 pages.

* cited by examiner

*Primary Examiner* — Yuriy Semenenko
(74) *Attorney, Agent, or Firm* — Fiala & Weaver P.L.L.C.

(57) ABSTRACT

Methods, systems, and apparatuses are provided for three-dimensional coiling via structures. A substrate includes a plurality of insulating layers, a plurality of trace layers interleaved with the insulating layers, and a three-dimensional coiling via. The three-dimensional coiling via includes a plurality of electrically conductive traces and a plurality of electrically conductive vias through the insulating layers. The electrically conductive traces are present in at least two of the traces layers and are coupled together by the electrically conductive vias. The electrically conductive traces are arranged to form at least one partial turn around an axis through the substrate.

15 Claims, 7 Drawing Sheets

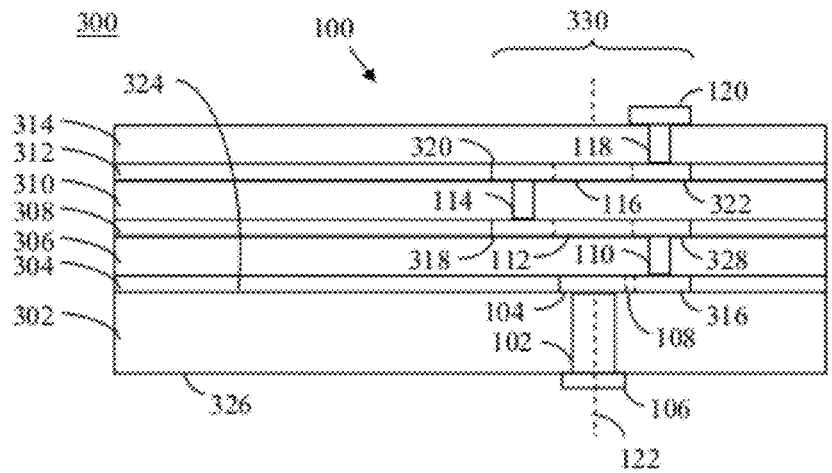
FIG. 3
402 — form at least one additional electrically conductive trace in a corresponding trace layer of the substrate to further form the at least a partial turn around the axis
FIG. 4
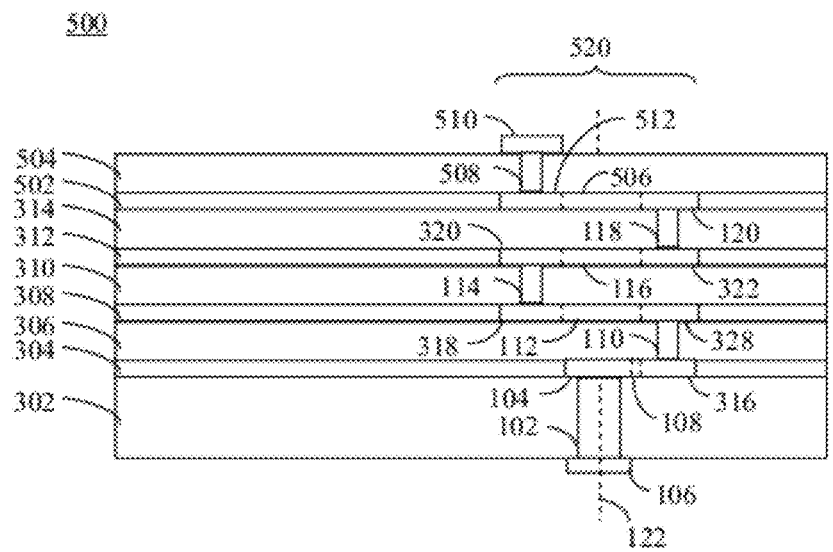
FIG. 5

THREE-DIMENSIONAL COILING VIA STRUCTURE FOR IMPEDANCE TUNING OF IMPEDANCE DISCONTINUITY

This application claims the benefit of U.S. Provisional Application No. 61/411,669, filed on Nov. 9, 2010, which is incorporated by reference herein in its entirety.

BACKGROUND OF THE INVENTION

1. Field of the Invention

The present invention relates to substrate via technology.

2. Background Art

Electrical impedance, or simply impedance, describes a measure of opposition to alternating current (AC). When an AC signal is transmitted through a conductor, such as a metal trace, the conductor provides some resistance to the AC signal in the form of electrical impedance. The path of the signal may include further features beyond the conductor, such as further conductor including further traces, vias (electrical connections through layers of circuit boards), and other circuit elements or features that each have corresponding impedances. When the signal conducts through the conductor and encounters a subsequent conductor, the signal may be distorted in some manner. If the impedance of the subsequent conductor matches the impedance of the prior conductor, the signal may continue through the subsequent conductor in an undistorted manner. If the impedance of the subsequent conductor does not match the impedance of the prior connector, a portion of the signal may continue through the subsequent conductor, and a portion of the signal may be reflected back down the prior connector. As such, the mismatched impedances cause a distortion to the signal, which is undesired.

Insertion loss (IL) and return loss (RL) are signal parameters used to indicate the magnitude of signal distortions in the event of mismatched impedances. Insertion loss is the loss of signal power resulting from the presence of a discontinuity in a signal path. Return loss (or reflection loss) is the loss of signal power resulting from the reflection caused at a discontinuity in a signal path.

Integrated circuit (IC) chips or dies from semiconductor wafers are typically interfaced with other circuits using a package that can be attached to a printed circuit board (PCB). Many types of IC packages exist. One such type of IC die package is a ball grid array (BGA) package. BGA packages provide for smaller footprints than many other package solutions available today. In a BGA package, one or more dies are mounted to a package substrate. An array of solder ball pads is located on a bottom external surface of the package substrate. Solder balls are attached to the solder ball pads. The solder balls may be reflowed to attach the package to the PCB. Further examples types of IC packages include quad flat package (QFP) (having leads extending from all four lateral sides), quad flat no lead (QFN) packages, etc.

A die is frequently mounted to a package substrate using solder balls, studs, or other structures that electrically couple signal pads of the die to land pads on the package structure. Such solder balls, studs, or other structures form signal interconnects. As such, a signal transmitted from an output driver of a die in an IC package passes through the interconnect between the die and the package substrate, one or more traces and vias of the package substrate, and an interconnect between the IC package and a circuit board. The voltage and current that make up the signal encounter each interconnect, trace, and via as an electrical impedance. If the impedances of the features through which the signal pass are the same, the signal may continue undistorted. If, however, the impedances of the features do not match, a portion of the signal will reflect from the point at which the mismatch occurs, and a portion of the signal will continue on in a distorted fashion.

In an example BGA package, a metal trace segment may make up a longer portion of the overall signal path, and may have a control impedance typically targeted in a range of 90 to 110 Ohms (differential). A via structure and BGA sections (the BGA pads and associated metal traces) of the BGA package make up the smaller segment of the overall signal path, and may typically have a lower impedance around 60 to 70 ohms differential. This change in the impedance profile between the metal trace and the via and/or the BGA section is an impedance discontinuity that can cause significant deteriorating effects on insertion loss, return loss, and the signal quality on the receiver end.

Previous techniques to match impedances in BGA packages in the industry include using "cut-outs" around solder ball pads to reduce capacitance, and therefore increase the impedance of the BGA section of a BGA package. However, the limits of this type of reduction may be reached before the desired target impedance is attained (i.e., the impedance does not increase enough to reach the desired value). In another previous technique, a planar two-dimensional trace is configured to create coiling to modify an electrical impedance in the signal path. However, a problem with this technique is that the additional trace that is used degrades insertion loss (e.g., due to conductor, surface roughness, and dielectric losses) and occupies a significant amount of space and substrate real-estate.

BRIEF SUMMARY OF THE INVENTION

Methods, systems, and apparatuses are described for three-dimensional coiling via structures substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 3 shows a side view of an example substrate in which the 3D coiling via conductor of FIG. 1 may be formed, according to an embodiment.

FIG. 4 shows an additional process for the flowchart of FIG. 2 to form further coiling, according to an example embodiment.

FIGS. 5 and 6 show side views of example substrates with additional insulating and trace layers to enable formation of coiling of a 3D coiling via conductor, according to embodiments.

Figure 1:
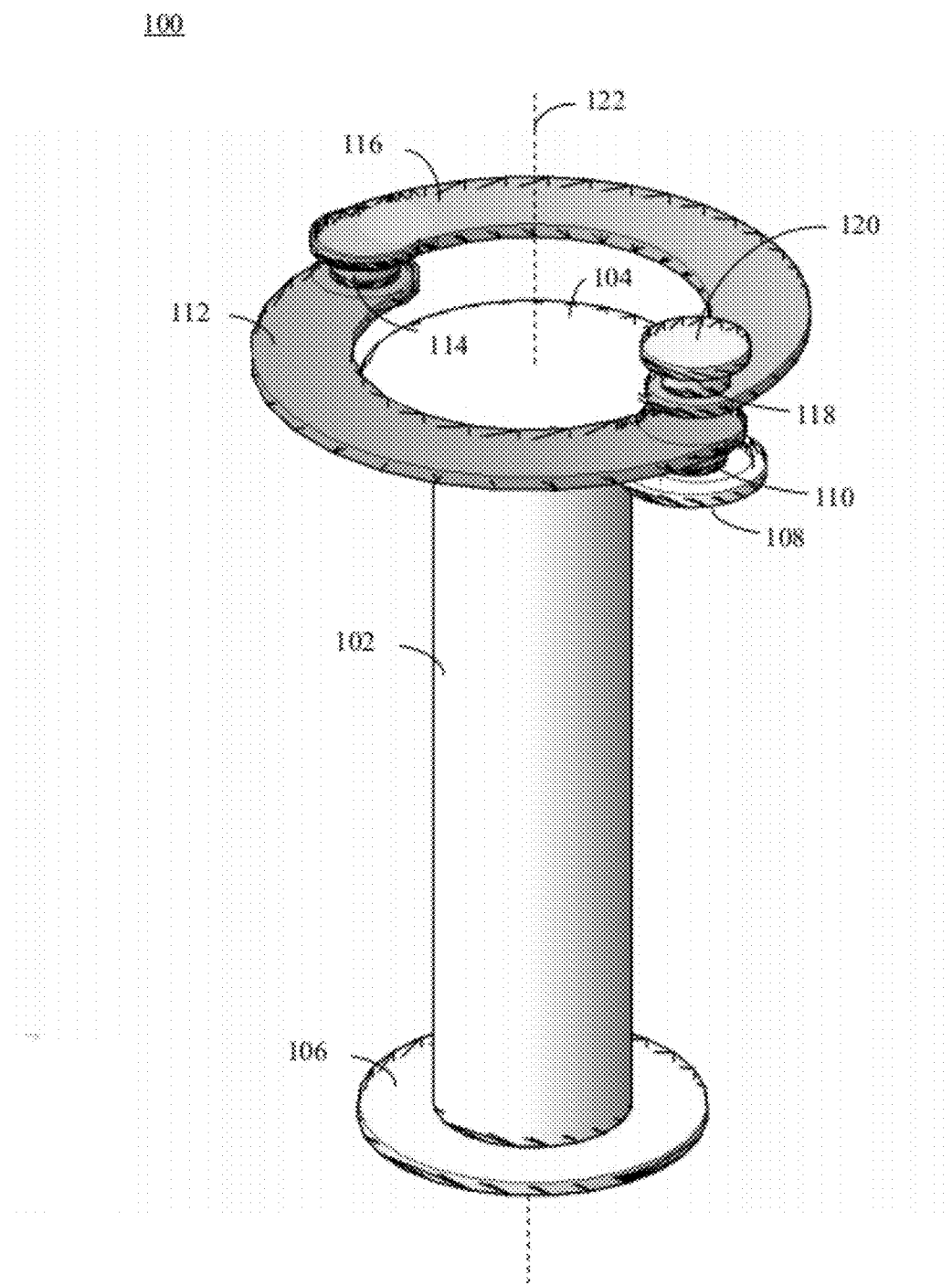
FIG. 1 shows an electrical conductor that includes a three-dimensional (3D) coiling via conductor, according to an example embodiment.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Example Embodiments

In embodiments, a three-dimensional (3D) coiling via structure or conductor is formed. The 3D coiling via structure may be used to tune signals transmitted through a substrate. For example, in an embodiment, a 3D coiling via structure may tune an impedance of a circuit discontinuity (e.g., via/BGA discontinuity) to match a trace impedance profile and to reduce/eliminate the discontinuity and reflections. The 3D coiling via structure may be tuned by adding or reducing partial or full coils or turns, and/or in further ways described elsewhere herein. The 3D coiling via structure/conductor may be implemented in various types of substrates, including circuit boards and substrates in integrated circuit (IC) packages. Examples of IC packages in which The 3D coiling via structure/conductor may be implemented include ball grid array (BGA) packages, quad flat packages (QFP), quad flat no lead (QFN) packages, land grid array (LGA) packages, pin grid array (PGA) packages, further types of surface mount packages, etc. For instance, one example embodiment is a coiling via structure for impedance tuning of BGA/via impedance discontinuity in a high speed (e.g., 10 Gbps) SerDes link interconnect of an IC package.

In embodiments, a three-dimensional (3D) coiling via structure or conductor enables better matching of impedances in substrates so that less signal reflections occur, causing less distortion to transmitted signals relative to previous technologies. Electrical impedance describes a measure of opposition to alternating current (AC) in a signal path. When an AC signal is transmitted through a conductor, such as a metal trace, the signal is transmitted along the conductor as an electrical impedance. The path of the signal may include further features beyond the conductor, such as further conductors, vias (electrical connections through layers of circuit boards), and other circuit elements or features that each have corresponding impedances. When the signal conducts through the conductor and encounters a subsequent conductor, the signal may be disadvantageously affected. If the impedance of the subsequent conductor matches the impedance of the prior connector, the signal may continue through the subsequent conductor in an undistorted manner. If the impedance of the subsequent conductor does not match the impedance of the prior connector, a portion of the signal may continue through the subsequent conductor, and a portion of the signal may be reflected back down the prior connector. As such, the mismatched impedances cause a distortion to the signal, which is undesired.

Impedance, Z, is fundamentally defined as $$Z = \sqrt{L/C}, \quad \text{Equation 1}$$

where
L=an inductance (e.g., in henries), and
C=a capacitance (e.g., in farads).

In embodiments, a 3D coiling via structure effects the inductance (L) in Equation 1, and along with adjustments in C (e.g., by a unique anti-pad configuration), the impedance can be tuned to substantially (nearly or exactly) match a trace impedance or impedance of other conductor. This, in turn, improves IL (insertion loss) and RL (return loss) characteristics and signal quality at a receiver for the signal. Insertion loss and return loss are signal parameters used to indicate the magnitude of signal distortions in the event of mismatched impedances. Insertion loss is the loss of signal power resulting from the presence of a discontinuity in a signal path. Return loss (or reflection loss) is the loss of signal power resulting from the reflection caused at a discontinuity in a signal path. Embodiments enable reductions in insertion loss and return loss relative to prior techniques.

3D coiling via structure/conductor embodiments may be implemented in various ways. In embodiments, a 3D coiling via structure/conductor may be formed through any number of metal trace layers and insulating layers of a substrate. Furthermore, a 3D coiling via structure/conductor may be formed to have any number of turns and/or partial turns, and any number of electrically conductive traces may be used to form each turn. Such traces may have any width and length, and may be made of any suitable materials, including a metal such as copper, aluminum, gold, silver, tin, nickel, lead, or a combination of metals/alloy, or may be formed of an alternative electrically conductive material. Furthermore, straight traces and/or curved traces may be used to form turns and/or partial turns of a 3D coiling via structure/conductor.

For instance, FIG. 1 shows an electrical conductor 100, according to an example embodiment. As shown in FIG. 1, electrical conductor 100 includes an electrically conductive first via 102, a via pad 104, an electrically conductive first trace 108, an electrically conductive second via 110, an electrically conductive second trace 112, an electrically conductive third via 114, an electrically conductive third trace 116, an electrically conductive fourth via 118, and a via pad 120. As shown in FIG. 1, second trace 112, third via 114, and third trace 116 form a single full coil or full turn around an axis 122 of electrical conductor 100, and as such form a 3D coiling via conductor portion of electrical conductor 100. Electrical conductor 100 is formed in a substrate, although the substrate is not visible in FIG. 1 for ease of illustration. Electrical conductor 100 may be internal to the substrate, or one or both ends (e.g., via pads 106 and 120) of electrical conductor 100 may be exposed at surfaces of the substrate.

Figure 2:
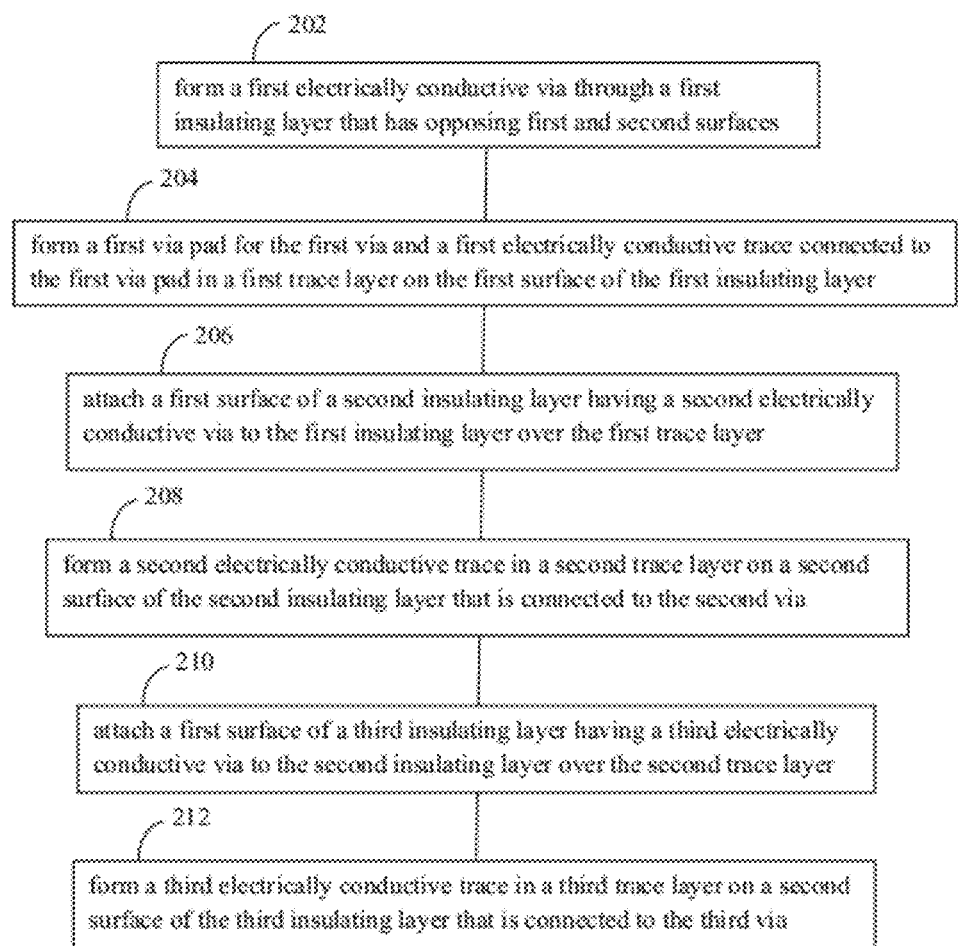
FIG. 2 shows a flowchart providing a process for forming a 3D coiling via conductor in a substrate, according to embodiments.

Electrical conductor 100 may be formed in various ways. For example, FIG. 2 shows a flowchart 200 providing a process for forming a 3D coiling via conductor in a substrate, according to embodiments. In an embodiment, electrical conductor 100 of FIG. 1 may be fabricated according to flowchart 200. Other structural and operational embodiments will be apparent to persons skilled in the relevant art(s) based on the discussion regarding flowchart 200. Note that the steps of flowchart 200 do not necessarily need to be performed in the order shown in FIG. 2, and in alternative embodiments may be performed in other orders.

Flowchart 200 is described as follows with respect to FIG. 1 and FIG. 3. FIG. 3 shows a side view of an example substrate 300 in which electrical conductor 100 is formed, according to an embodiment. As shown in FIG. 3, substrate 300 includes a first insulating layer 302, a first trace layer 304, a second insulating layer 306, a second trace layer 308, a third insulating layer 310, a third trace layer 312, and a fourth insulating layer 314. First-fourth insulating layers 302, 306, 310, and 314 are electrically insulating substrate layers. First-third trace layers 304, 308, and 312 are metal layers that may include one or more electrically conductive circuit features, such as traces, via pads, solder ball pads, etc. As shown in FIG. 3, electrical conductor 100 is formed in substrate 300, with metal traces and pads of electrical conductor 100 formed in trace layers, and vias of electrical conductor 100 formed through insulating layers.

In embodiments, first-fourth insulating layers 302, 306, 310, and 314 (and any further insulating layers mentioned elsewhere herein) may be made of various materials, including ceramic, plastic, tape, and/or other suitable materials. For example, first-fourth insulating layers 302, 306, 310, and 314 may be made from an organic material such as BT (bismaleimide triazine) laminate/resin, a flexible tape material such as polyimide, a flame retardant fiberglass composite substrate board material (e.g., FR-4), etc. First-third trace layers 304, 308, and 312 (and any further trace layers mentioned elsewhere herein) may be made of various materials, including metal foils that are patterned to form circuit features (such as traces, via pads, solder ball pads) and/or of other materials. Examples of metals that may be included in first-third trace layers 304, 308, and 312 include copper, aluminum, gold, silver, tin, nickel, lead, or a combination of metals/alloy. The electrically conductive trace layers and non-conductive insulating layers can be stacked and laminated together, or otherwise attached to each other, to form substrate 300, in a manner as would be known to persons skilled in the relevant art(s). Note that although other layers are not shown in substrate 300, substrate 300 may include additional layers, including further types of layers, such as metal planes (e.g., ground planes, power planes, etc.), and/or other layers.

Referring back to FIG. 2, flowchart 200 begins with step 202. In step 202, a first electrically conductive via is formed through a first insulating layer that has opposing first and second surfaces. For example, as shown in FIG. 3, first via 102 is formed through first insulating layer 302. As shown in FIG. 3, first insulating layer 302 has opposing first and second surfaces 324 and 326 (as do the other insulating layers in substrate 300).

In step 204, a first via pad for the first via and a first electrically conductive trace connected to the first via pad are formed in a first trace layer on the first surface of the first insulating layer. For instance, referring to FIGS. 1 and 3, a via pad 104 for first via 102 and first trace 108 are formed in first trace layer 304 on first surface 324 of first insulating layer 302. First trace 108 is connected to via pad 104.

In step 206, a first surface of a second insulating layer having a second electrically conductive via is attached to the first insulating layer over the first trace layer. For example, referring to FIGS. 1 and 3, second via 110 is formed through second insulating layer 306. Second insulating layer 306 has a first surface attached to first insulating layer 302 over first trace layer 304. Furthermore, second via 110 is connected to first trace 108. For instance, second via 110 may have a via pad 316 formed in first trace layer 304, and first trace 108 may be connected to via pad 316 in first trace layer 304.

In step 208, a second electrically conductive trace is formed in a second trace layer on a second surface of the second insulating layer that is connected to the second via. For example, referring to FIGS. 1 and 3, second trace 112 is formed in second trace layer 308 on a second surface of second insulating layer 306. Second trace 112 is connected to second via 110 in second trace layer 308. For instance, second via 110 may have a via pad 328 formed in second trace layer 308, and second trace 112 may be connected to via pad 328 in second trace layer 308.

In step 210, a first surface of a third insulating layer having a third electrically conductive via is attached to the second insulating layer over the second trace layer. For example, referring to FIGS. 1 and 3, third via 114 is formed through third insulating layer 310. Third insulating layer 310 has a first surface attached to second insulating layer 306 over second trace layer 308. Furthermore, third via 114 is connected to second trace 112. For instance, third via 114 may have a via pad 318 formed in second trace layer 308, and second trace 112 may be connected to via pad 318 in second trace layer 308.

In step 212, a third electrically conductive trace is formed in a third trace layer on a second surface of the third insulating layer that is connected to the third via. For example, referring to FIGS. 1 and 3, third trace 116 is formed in third trace layer 312 on a second surface of third insulating layer 310. Third trace 116 is connected to third via 114 in third insulating layer 310. For instance, third via 114 may have a via pad 320 formed in third trace layer 312, and third trace 116 may be connected to via pad 320 in third trace layer 312.

Note that in an embodiment, flowchart 200 may include further steps. For example, flowchart 200 may include a step of attaching fourth insulating layer 314 (having fourth via 118) to third insulating layer 310 over trace layer 312, as shown in FIG. 3. Fourth via 118 is connected to third trace 116. For instance, third trace 116 may be connected to a via pad 322 of fourth via 118 in fourth trace layer 312. Furthermore, flowchart 200, may include the step of forming via pad 120 of fourth via 118 in a fourth trace layer on an outer surface of fourth insulating layer 314. Via pad 120 may optionally be used as, or may be coupled to, a solder ball pad, a land pad for a solder bump of an IC die, or other circuit feature.

As such, electrical conductor 100 includes first via 102, first trace 108, second via 110, second trace 112, third via 114, third trace 116, and fourth via 118 (including via pads 106, 104, 316, 328, 318, 320, 322 and 120) in series to form an electrical connection through substrate 300. Furthermore, electrical conductor 100 includes a 3D coiling via structure 330 formed by second trace 112, third via 114, and third trace 116. 3D coiling via structure 330 provides a configurable impedance for electrical conductor 100. This impedance may be configured by selecting/configuring lengths, shapes, widths, thicknesses, and/or other parameters of second trace 112, third via 114, and third trace 116, and/or by adding additional traces and/or vias to add additional coiling. The impedance may be used to match other impedances in a signal path that includes electrical conductor 100. For instance, electrical conductor 100 may be configured to match an impedance of a metal trace on a surface of substrate 300 that connects with via pad 120 or via pad 106, an impedance of a solder bump connection with an IC die, an impedance of a solder ball coupled to via pad 120 or via pad 106, etc.

As shown in FIG. 1, second and third traces 112 and 116 in second and third traces layers 308 and 312 (shown in FIG. 3) are arranged to collectively form a full turn around an axis 122 through substrate 300. Alternatively, second and third traces 112 and 116 may collectively form a partial turn (e.g., a half turn, a three-quarters turn, etc.), or greater than a full turn (e.g., one and a half turns, one and three-quarters turns, etc.). Furthermore, additional insulating layers and metal traces layers may be stacked on substrate 300 to form further partial and/or full turns around axis 122. For instance, in an embodiment, flowchart 200 may include a further step 402 shown in FIG. 4. As shown in FIG. 4, in step 402, at least one additional electrically conductive trace is formed in a corresponding trace layer of the substrate to further form the at least a partial turn around the axis. According to step 402, any number of additional traces may be formed in corresponding trace layers to provide further coiling, and therefore to further configure a 3D coiling via conductor as a matching impedance.

Figure 6:
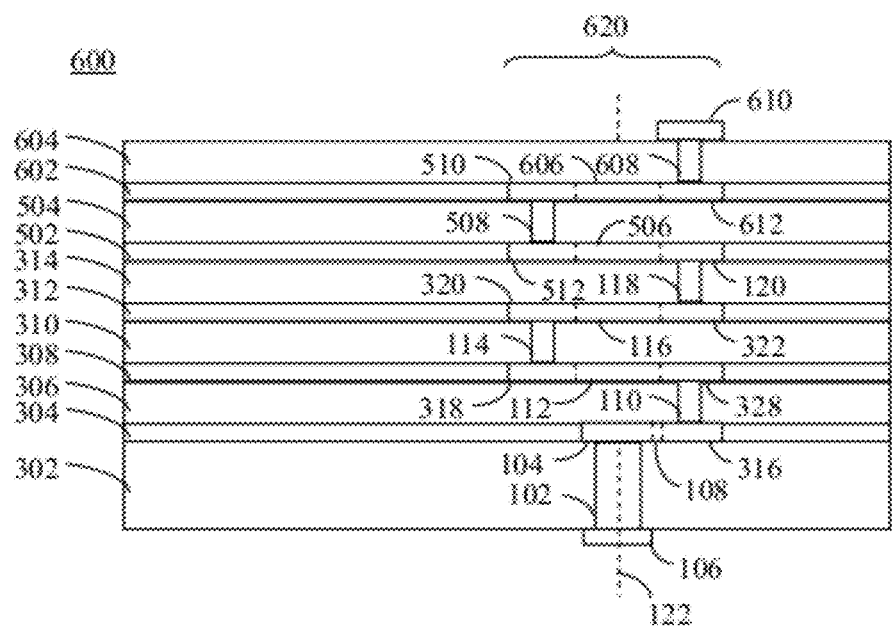

For instance, step 402 is described with respect to FIGS. 5 and 6 for illustrative purposes. FIGS. 5 and 6 show example substrates with additional insulating and trace layers to enable further coiling of a 3D coiling via conductor, according to embodiments. FIG. 5 shows a substrate 500 that is generally the same as substrate 300 of FIG. 3, with additional processing according to step 402 to add further coiling. As shown in FIG. 5, substrate 500 includes insulating layers 302, 306, 310, and 314, and trace layers 304, 308, and 312, which are interleaved as shown in FIG. 3. Furthermore, substrate 500 includes a fourth trace layer 502 formed on a surface of fourth insulating layer 314, and a fifth insulating layer 504 formed on a surface of fourth insulating layer 314 over fourth trace layer 502.

As shown in FIG. 5, a fourth trace 506 is formed in fourth trace layer 502. Fourth trace 506 is connected to fourth via 118 in fourth trace layer 502. For instance, fourth via 118 may have a via pad 120 formed in fourth trace layer 502, and fourth trace 506 may be connected to via pad 120 in fourth trace layer 502. Furthermore, fifth via 508 is formed through fifth insulating layer 504. Fifth via 508 is connected to fourth trace 506. For instance, fifth via 508 may have a via pad 512 formed in fourth trace layer 502, and fourth trace 506 may be connected to via pad 512 in fourth trace layer 502. Furthermore, a via pad 510 may be formed for fifth via 508 in a fifth trace layer on an outer surface of fifth insulating layer 504. Via pad 510 may optionally be used as, or may be coupled to, a solder ball pad, a land pad for a solder bump of an IC die, or other circuit feature.

As such, in FIG. 5, an electrical conductor is formed that includes electrical conductor 100 of FIG. 3 with the additional of fourth trace 506 and fifth via 508 (and associated via pads). In the example of FIG. 5, second, third, and fourth traces 112, 116, and 506 and vias 114 and 118 form a 3D coiling via structure 520, which provides a configurable impedance. Second, third, and fourth traces 112, 116, and 506 in second-fourth traces layers 308, 312 and 502 may be shaped as half-circles, and as such are arranged to collectively form one and a half turns around axis 122 through substrate 300. In other embodiments, second, third, and fourth traces 112, 116, and 506 may have other shapes/lengths mentioned elsewhere herein or otherwise known, to form a partial turn, a full turn, or additional partial and/or full turns around axis 122.

In another example, FIG. 6 shows a substrate 600 that is generally the same as substrate 500 of FIG. 5, with additional processing according to step 402 to add further coiling. As shown in FIG. 6, substrate 600 includes insulating layers 302, 306, 310, 314, and 504, and trace layers 304, 308, 312, and 502, which are interleaved as shown in FIG. 5. Furthermore, substrate 600 includes a fifth trace layer 602 formed on a surface of fifth insulating layer 504, and a sixth insulating layer 604 formed on a surface of fifth insulating layer 504 over fifth trace layer 602.

As shown in FIG. 6, a fifth trace 606 is formed in fifth trace layer 602. Fifth trace 606 is connected to fifth via 508 in fifth trace layer 602. For instance, fifth via 508 may have a via pad 510 formed in fifth trace layer 602, and fifth trace 606 may be connected to via pad 510 in fifth trace layer 602. Furthermore, sixth via 608 is formed through sixth insulating layer 604. Sixth via 608 is connected to fifth trace 606. For instance, sixth via 608 may have a via pad 612 formed in fifth trace layer 602, and fifth trace 606 may be connected to via pad 612 in fifth trace layer 602. Furthermore, a via pad 610 may be formed for sixth via 608 in a sixth trace layer on an outer surface of sixth insulating layer 604. Via pad 610 may optionally be used as, or may be coupled to, a solder ball pad, a land pad for a solder bump of an IC die, or other circuit feature.

As such, in FIG. 6, an electrical conductor is formed that includes electrical conductor 100 of FIG. 3 with the additional of fourth trace 506, fifth via 508, fifth trace 606, and sixth via 608 (and associated via pads). In the example of FIG. 6, Second-fifth traces 112, 116, 506, and 606 and vias 114, 118, and 508 form a 3D coiling via structure 620, which provides a configurable impedance. Second-fifth traces 112, 116, 506, and 606 in second-fifth traces layers 308, 312, 502, and 602 may be shaped as half-circles, and as such are arranged to collectively form two full turns around axis 122 through substrate 300. In other embodiments, second-fifth traces 112, 116, 506, and 606 may have other shapes/lengths mentioned elsewhere herein or otherwise known, to form a partial turn, a full turn, or additional partial and/or full turns around axis 122.

Figure 7:
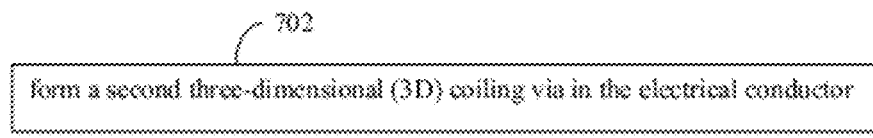
FIG. 7 shows an additional process for the flowchart of FIG. 2 to form an additional 3D coiling via structure, according to an example embodiment.

Furthermore, in embodiments, a second 3D coiling via (and optionally additional 3D coiling vias) may be implemented in an electrical conductor, such as electrical conductor 100 of FIG. 1. For instance, in an embodiment, flowchart 200 of FIG. 2 may include an additional step 702 shown in FIG. 7. In step 702, a second three-dimensional (3D) coiling via may be formed in the electrical conductor. Such a second 3D coiling via may be formed in a substrate coiled in a same direction or opposite direction to the first 3D coiling via, and may provide further benefits in configuring the electrical conductor as a matching impedance.

Figure 8:
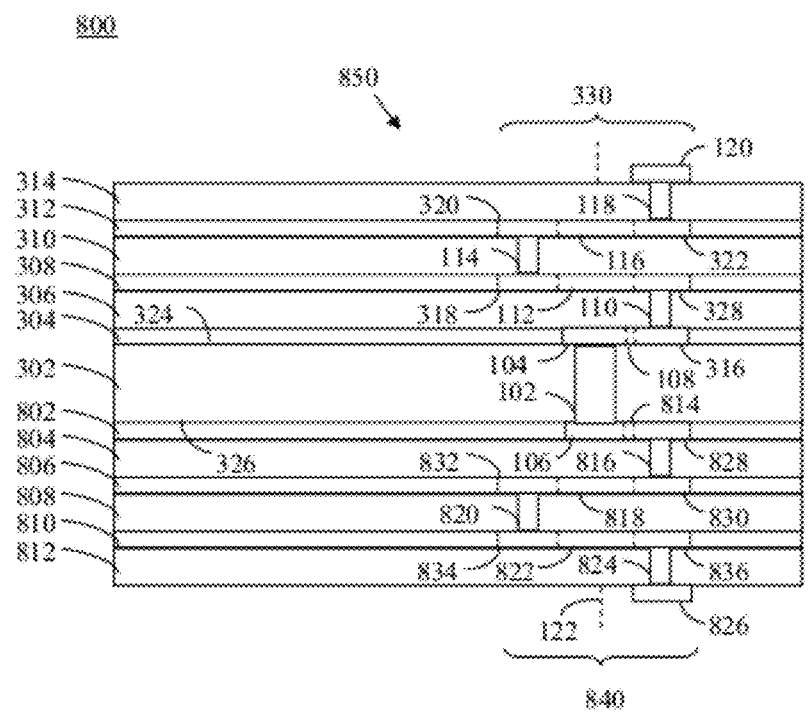
FIG. 8 shows a side view of an example substrate in which first and second 3D coiling via structures are formed in series, according to an embodiment.

For instance, FIG. 8 shows a substrate 800 that is generally the same as substrate 300 of FIG. 3, with additional processing according to step 702 to add a second 3D coiling via structure in parallel with a first 3D coiling via structure, according to an example embodiment. As shown in FIG. 8, substrate 800 includes layers 302-314 stacked as shown in substrate 300 in FIG. 3. Furthermore, substrate 800 includes a fourth trace layer 802, a fifth insulating layer 804, a fifth trace layer 806, a fifth insulating layer 808, a sixth trace layer 810, and a sixth insulating layer 812. Layers 802-812 may be formed on surface 326 of first insulating layer 302 to form a second 3D coiling via structure in substrate 800 that is a mirror image of the first coiling via structure (e.g., as shown in FIGS. 1 and 3). For instance, steps 204, 206, 208, 210, and 212 of flowchart 200 (FIG. 2) may be repeated during step 702 to form the second 3D coiling via structure in substrate 800.

For example, as shown in FIG. 8, a fourth trace 814 is formed in fourth trace layer 802. Fourth trace 814 is connected between first via 102 (e.g., at via pad 106 of first via 102) and a fourth via 816 (e.g., at a via pad 828 of a fifth via 816) in fourth trace layer 802. Fifth via 816 is formed through fifth insulating layer 804. A fifth trace 818 is connected between fifth via 816 (e.g., at a via pad 830 of fifth via 816) and a sixth via 820 (e.g., at a via pad 832 of sixth via 820) in fifth trace layer 806. Sixth via 820 is formed through sixth insulating layer 808. A sixth trace 822 is connected between sixth via 820 (e.g., at a via pad 834 of sixth via 820) and a seventh via 824 (e.g., at a via pad 836 of seventh via 824) in sixth trace layer 810. Seventh via 824 is formed through seventh insulating layer 812. Furthermore, a via pad 826 may be formed for seventh via 824 in a trace layer on an outer surface of seventh insulating layer 812. Via pad 826 may optionally be used as, or may be coupled to, a solder ball pad, a land pad for a solder bump of an IC die, or other circuit feature.

In the example of FIG. 8, traces 818 and 822 and via 820 form a second 3D coiling via structure 840 in substrate 800, in addition to 3D coiling via structure 330. First and second 3D coiling via structures 330 and 840 provide a configurable impedance for an electrical conductor 850 formed in substrate 800. Electrical conductor 850 includes seventh via 824, sixth trace 822, sixth via 820, fifth trace 818, fifth via 816, fourth trace 814, first via 102, first trace 108, second via 110, second trace 112, third via 114, third trace 116, and fourth via 118 (including via pads 826, 836, 834, 832, 830, 828, 106, 104, 316, 328, 318, 320, 322 and 120) in series to form an electrical connection through substrate 300.

As described above, any number of traces may be combined (coupled by vias) to form one or more partial and/or full turns or coils around an axis through a substrate. Furthermore, the traces themselves may have any shape, including being straight, curved (e.g., circular, such as a quarter circle, a semi-circle, a three-quarters circle, etc.), a combination of straight and curved, or other shape, to enable the turns or coils.

Figure 9:
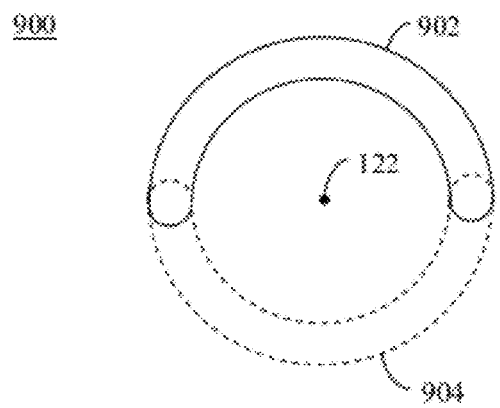
FIGS. 9-11 show views of examples of traces arranged to form turns in 3D coiling via structures, according to embodiments.
Figure 10:
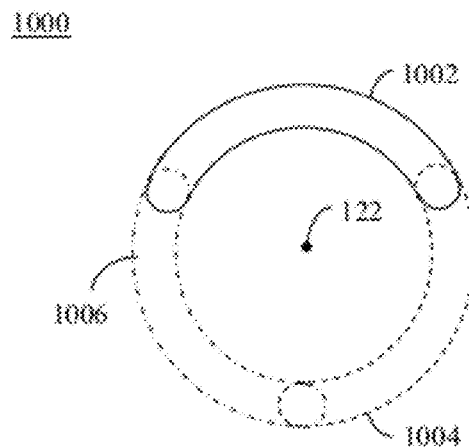
Figure 11:
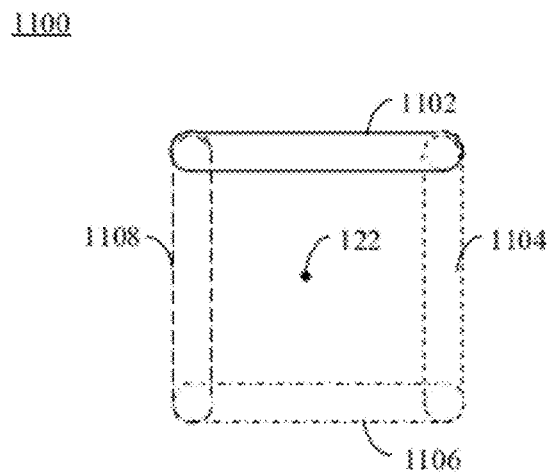

For instance, FIGS. 9-11 show views of examples of traces arranged to form turns in 3D coiling via structures, according to example embodiments. In FIGS. 9-11, a surface of a substrate is shown (e.g., showing a top surface of a substrate that is not visible for ease of illustration). For instance, as shown in FIG. 9, first and second traces 902 and 904 are included in a 3D coiling via structure 900 in a substrate. First and second traces 902 and 904 form a turn around an axis 122 through the substrate. First and second traces 902 and 904 are both curved in a half circle to form a full turn similarly to second trace 112 and third trace 116 of FIG. 1. First and second traces 902 and 904 are coupled in series by a via (not visible in FIG. 9) through an insulating layer. First trace 902 is in first trace layer of the substrate, and second trace 904 is in a second trace layer of the substrate (as indicated by dotted line) separated by the insulating layer.

As shown in FIG. 10, first, second, and third traces 1002, 1004, and 1006 are included in a 3D coiling via structure 1000 in a substrate. First-third traces 1002, 1004, and 1006 form a turn around an axis 122 through the substrate. First-third traces 1002, 1004, and 1006 are each curved as a third of a circle to form a full turn. First-third traces 1002, 1004, and 1006 are coupled in series by first and second vias (not visible in FIG. 10) through corresponding insulating layers. First trace 1002 is in first trace layer of the substrate, second trace 1004 is in a second trace layer of the substrate (as indicated by dotted line) separated by the first insulating layer, and third trace 1006 is in a third trace layer of the substrate (as indicated by dotted line) separated by the second insulating layer.

As shown in FIG. 11, first, second, third, and fourth traces 1102, 1104, 1106, and 1108 are included in a 3D coiling via structure 1100 in a substrate. First-fourth traces 1102, 1104, 1106, and 1108 form a turn around an axis 122 through the substrate. First-fourth traces 1102, 1104, 1106, and 1108 are each straight, and each form a side of a rectangle to form a full turn. First-fourth traces 1102, 1104, 1106, and 1108 are coupled in series by first-third vias (not visible in FIG. 11) through corresponding insulating layers. First trace 1102 is in first trace layer of the substrate, second trace 1104 is in a second trace layer of the substrate (as indicated by dotted line) separated by the first insulating layer, third trace 1106 is in a third trace layer of the substrate (as indicated by dotted line) separated by the second insulating layer, and fourth trace 1108 is in a fourth trace layer of the substrate (as indicated by dotted line) separated by the third insulating layer.

FIGS. 9-11 are provided as exemplary embodiments, and are not intended to be limiting. In further embodiments, additional traces may be present to form a turn (e.g., five traces that form a full turn, six traces that form a full turn, etc.), the traces may have different lengths, widths, and/or shapes, and may be combined to form other shapes (e.g., a triangle formed by three straight traces, a pentagon formed by five straight traces, etc.).

As described above, substrate embodiments, such as substrates 300, 500, 600, and 800, may be included in IC packages. The electrical conductors in the substrates that include 3D coiling via structures may be included in electrical signal paths in the IC packages to electrically connect various circuit features, such as connecting IC die signals to interconnects of the IC packages that connect the IC packages to circuit boards (e.g., solder balls, pins, leads, etc.). The 3D coiling via structures may be used to match conductive features of the IC packages, such as by increasing an inductance, and therefore an impedance of the electrical conductors.

Figure 12:
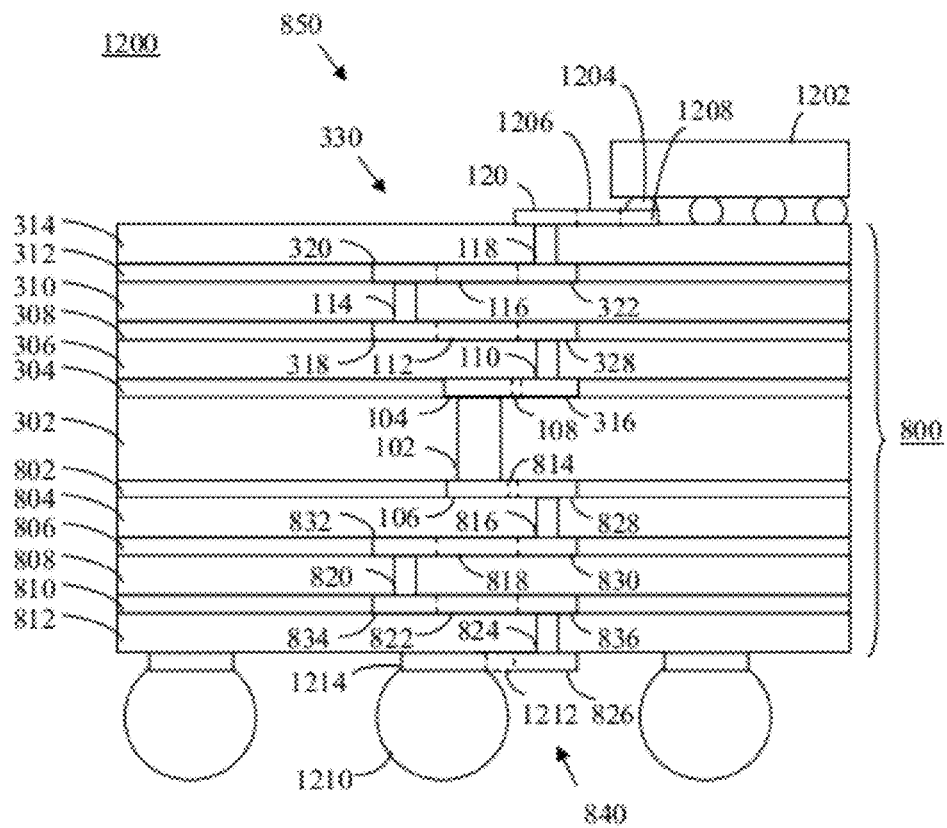
FIG. 12 shows a side view of an IC package that includes 3D coiling via structures, according to an example embodiment.

For instance, FIG. 12 shows a side view of a portion of an IC package 1200 that includes 3D coiling via structures, according to an example embodiment. As shown in FIG. 12, IC package 1200 includes substrate 800 of FIG. 8, an IC die 1202, and an array of solder balls (including a solder ball 1210). IC package 1200 is an example of a ball grid array (BGA) package.

As shown in FIG. 12, IC die 1202 is mounted to a first surface (e.g., a top surface) of substrate 800, being mounted to insulating layer 314. IC die 1202 has die terminals (e.g., I/O pads) that are coupled to land pads (an example land pad 1208 is shown) on the surface of substrate 800 by an array of solder bumps, including a solder bump 1204. As shown in FIG. 12, solder bump 1204 connects a terminal of die 1202 to land pad 1208. A trace 1206 on the surface of substrate 800 connects land pad 1208 to via pad 120.

The array of solder balls is formed on a second surface (e.g., bottom surface) of substrate 800. Each solder ball is attached to a corresponding solder ball pad formed on the second surface of substrate 800. For example, solder ball 1210 is attached to a solder ball pad 1214. A trace 1212 on the bottom surface of substrate connects solder ball pad 1214 to via pad 826. As such, the terminal of die 1202 of solder bump 1204 is connected through substrate 800 by electrical conductor 850 to solder ball 1210 (through trace 1212 and solder ball pad 1214). When IC package 1200 is mounted to a circuit board (e.g., a PCB), the solder ball array may be reflowed to attach each solder ball to a corresponding land pad on the circuit board. In this manner, a signal may be connected between the land pad attaching solder ball 1210 to the circuit board, through electrical conductor 850, to die 1202 (at solder bump 1204). Furthermore, the 3D coiling via structures 330 and 840 in electrical conductor 850 may be used to match impedances associated with die 1202, solder bump 1204, traces 1206 and 1212, solder ball 1210, and/or a trace on the circuit board to which package 1200 is mounted.

Package 1200 is shown for purposes of illustration in FIG. 12, and in other embodiments, 3D coiling via structures may be implemented in substrates of other types of IC packages mentioned elsewhere herein or otherwise known.

Note that the vias described herein may the same type of vias or different types of vias. For instance, referring to FIG. 3, vias 102, 110, 114, and 118 may be the same type of vias, or may different types of vias. For example, via 102 may be a core or "large" via, and vias 110, 114, and 118 may be microvias (e.g., relatively small diameter vias in high density substrates). In such an embodiment, insulating layer 302 may be a core substrate layer of substrate 300, and may have a greater thickness than other insulating layers. Also, in embodiments, 3D coiling via structures may coil or loop around an axis that is coaxial with the core via (e.g., as shown in FIGS. 1, 3, 5, 6, 8, and 12), or the core via and the 3D coiling via structures may not necessarily be coaxial, where axis 122 is not coaxial with an axis of via 102. For instance, in such an embodiment where via 102 is not coaxial with the coils/loops, trace 108 (and trace 814, when present) may have a greater length than shown in FIGS. 1, 3, 5, 6, 8, and 12 to enable via 102 to be positioned in a non-coaxial position with axis 122 (e.g., further over to the left in substrate 300 in FIG. 3).

Embodiments can use standard materials, process, and technologies in place and do not use additional real-estate in IC packages. As described herein, the coiling may be increased (e.g., by one or more additional turns and/or partial turns) to increase inductance. Furthermore, inductance may be increased by including multiple 3D coiling via structures in an electrical conductor of an IC package.

Impedance may also be increased through the use of "cutouts." Cutouts may be formed in plane metallization in one or more metal planes of a substrate. Such cutouts are open spaces in the metalized plane. Such cutouts may be formed in the plane metallization in substrate layers above the solder ball pads (and also below and above the core via pads (e.g., via pads 104 and 106, when via 102 is a core via) to reduce capacitance. The reduced capacitance results in an increased impedance Z (according to Equation 1 above). 3D coiling via structures increase the inductance (L) and thereby also increase impedance Z. Thus, in embodiments, 3D coiling via structures and cutouts may both be formed in substrates of IC packages to increase impedance.

The cutouts can be reduced or eliminated to still yield the target impedance while the reduction and/or removal of the cutouts provides additional "isolation" and "shielding" which helps improve cross talk performance (which may be stringent and key attribute high speed channel performance). Previous techniques only leveraged cutouts to reduce capacitance, which in turn reduces the isolation and shielding of the adjacent and co-plane ground or power metallization, and has a negative impact on cross talk performance. Other previous techniques using planer traces to create a coil (i.e., a coil formed in a single trace layer) utilize significant amounts of package space and increase trace length, which worsens IL performance Embodiments described herein do not have these draw-backs.

As described above, embodiments may be implemented using only via structures and/or combination of via structures and coiling trace sections, in both cases creating a 3D coiling structure. Embodiments are applicable in IC packages, may be used in printed circuit boards (PCB), and in silicon structures such as micro-electromechanical systems (MEMS) devices.

Embodiments reduce differential return loss/insertion loss/crosstalk through package design optimization. Example embodiments may have various parameters, including increasing a via antipad (clearance hole between the via barrel and no-connect metal layer) by increasing a microvia from +62.6 um to 150 um in diameter, a core via from 75 um to 100 um in diameter, a core via pitch increased from 850 μm to 1000 μm, implementing a +/−10% impedance tolerance specification, which is an improvement over previous +/−15% specification. A discontinuity dip due to a via/BGA impedance is decreased due to the antipad and via pitch adjustments.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A substrate, comprising:
   a plurality of insulating layers;
   a plurality of trace layers interleaved with the insulating layers; and
   a three-dimensional (3D) coiling via that includes a plurality of electrically conductive traces and a plurality of electrically conductive vias through the insulating layers, the electrically conductive traces being present in at least two of the traces layers and being coupled together by the electrically conductive vias, the electrically conductive traces being arranged to form at least one partial turn around an axis through the substrate, the 3D coiling via being configured to reduce at least one of an insertion loss characteristic or a return loss characteristic of a signal trace of the substrate.

2. The substrate of claim 1, wherein the 3D coiling via includes:
   an electrically conductive first via through a first insulating layer having opposing first and second surfaces;
   a first via pad for the first via and an electrically conductive first trace connected to the first via pad in a first trace layer on the first surface of the first insulating layer;
   an electrically conductive second via through a second insulating layer having a first surface attached to the first insulating layer over the first trace layer, the second via being connected to the first trace;

an electrically conductive second trace in a second trace layer on a second surface of the second insulating layer that is connected to the second via;

an electrically conductive third via through a third insulating layer having a first surface attached to the second insulating layer over the second trace layer, the third via being connected to the second trace; and an electrically conductive third trace in a third trace layer on a second surface of the third insulating layer that is connected to the third via;

the electrically conductive second and third traces being arranged to form at least a partial turn around an axis through the substrate.

3. The substrate of claim 2, further comprising:

an electrically conductive fourth via through a fourth insulating layer having a first surface attached to the third insulating layer over the third trace layer, the fourth via being connected to the third trace; and a first land pad connected to the fourth via in a fourth trace layer on a second surface of the fourth insulating layer.

4. The substrate of claim 2, wherein the electrically conductive first via is coaxial with the axis through the substrate.

5. The substrate of claim 2, wherein the electrically conductive first via is not coaxial with the axis through the substrate.

6. The substrate of claim 3, further comprising:

a second via pad for the first via and an electrically conductive fourth trace connected to the second via pad in a fourth trace layer on the second surface of the first insulating layer;

an electrically conductive fourth via through a fourth insulating layer having a first surface attached to the first insulating layer over the fourth trace layer, the fourth via being connected to the fourth trace;

an electrically conductive fifth trace in a fifth trace layer on a second surface of the fourth insulating layer that is connected to the fourth via;

an electrically conductive fifth via through a fifth insulating layer having a first surface attached to the fourth insulating layer over the fifth trace layer, the fifth via being connected to the fifth trace; and an electrically conductive sixth trace in a sixth trace layer on a second surface of the fifth insulating layer that is connected to fifth via;

the fifth and electrically conductive sixth traces being arranged to form at least a partial turn around a second axis through the substrate.

7. The substrate of claim 1, wherein the electrically conductive traces include at least one straight trace.

8. The substrate of claim 1, wherein the electrically conductive traces include at least one curved trace.

9. The substrate of claim 1, wherein the electrically conductive vias include at least one microvia.

10. A substrate, comprising:

a three-dimensional (3D) coiling via that includes a plurality of electrically conductive traces in a plurality of trace layers of the substrate and a plurality of electrically conductive vias through a plurality of insulating layers of the substrate, the 3D coiling via including:

an electrically conductive first via through a first insulating layer having opposing first and second surfaces;

a first via pad for the first via and an electrically conductive first trace connected to the first via pad in a first trace layer on the first surface of the first insulating layer;

an electrically conductive second via through a second insulating layer having a first surface attached to the first insulating layer over the first trace layer, the second via being connected to the first trace;

an electrically conductive second trace in a second trace layer on a second surface of the second insulating layer that is connected to the second via;

an electrically conductive third via through a third insulating layer having a first surface attached to the second insulating layer over the second trace layer, the third via being connected to the second trace; and an electrically conductive third trace in a third trace layer on a second surface of the third insulating layer that is connected to the third via;

the electrically conductive second and third traces being arranged to form at least a partial turn around an axis through the substrates;

the 3D coiling via being configured to reduce at least one of an insertion loss characteristic or a return loss characteristic of a signal trace of the substrate.

11. The substrate of claim 10, further comprising:

an electrically conductive fourth via through a fourth insulating layer having a first surface attached to the third insulating layer over the third trace layer, the fourth via being connected to the third trace; and a first land pad connected to the fourth via in a fourth trace layer on a second surface of the fourth insulating layer.

12. The substrate of claim 10, further comprising:

a second via pad for the first via and an electrically conductive fourth trace connected to the second via pad in a fourth trace layer on the second surface of the first insulating layer;

an electrically conductive fourth via through a fourth insulating layer having a first surface attached to the first insulating layer over the fourth trace layer, the fourth via being connected to the fourth trace;

an electrically conductive fifth trace in a fifth trace layer on a second surface of the fourth insulating layer that is connected to the fourth via;

an electrically conductive fifth via through a fifth insulating layer having a first surface attached to the fourth insulating layer over the fifth trace layer, the fifth via being connected to the fifth trace; and an electrically conductive sixth trace in a sixth trace layer on a second surface of the fifth insulating layer that is connected to fifth via;

the fifth and electrically conductive sixth traces being arranged to form at least a partial turn around a second axis through the substrate.

13. The substrate of claim 10, wherein the electrically conductive second trace is a straight trace.

14. The substrate of claim 10, wherein the electrically conductive second trace is a curved trace.

15. The substrate of claim 10, further comprising:

at least one additional electrically conductive trace formed in a corresponding trace layer of the substrate, the second, third, and at least one additional electrically conductive traces being arranged to form the at least a partial turn around the axis through the substrate.

\* \* \* \* \*